(12) United States Patent
Ryoki

(10) Patent No.: US 9,583,523 B2
(45) Date of Patent: Feb. 28, 2017

(54) PHOTOELECTRIC CONVERSION DEVICE AND IMAGING SYSTEM

(71) Applicant: CANON KABUSHIKI KAISHA, Tokyo (JP)

(72) Inventor: Tatsuya Ryoki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/863,060

(22) Filed: Sep. 23, 2015

(65) Prior Publication Data

US 2016/0093657 A1 Mar. 31, 2016

(30) Foreign Application Priority Data

Sep. 29, 2014 (JP) ................................ 2014-199154

(51) Int. Cl.
*H01L 27/146* (2006.01)

(52) U.S. Cl.
CPC .. *H01L 27/14623* (2013.01); *H01L 27/14603* (2013.01); *H01L 27/14632* (2013.01); *H01L 27/14665* (2013.01)

(58) Field of Classification Search
None
See application file for complete search history.

(56) References Cited

U.S. PATENT DOCUMENTS

| | | | | |
|---|---|---|---|---|
| 5,680,229 A | * | 10/1997 | Yamanobe | ............. H04N 1/024 257/55 |
| 2008/0246107 A1 | * | 10/2008 | Maehara | ............. H01L 27/1462 257/432 |
| 2008/0290382 A1 | * | 11/2008 | Hirota | ............... H01L 27/14627 257/291 |
| 2009/0153708 A1 | * | 6/2009 | Hirota | ............... H01L 27/14629 348/294 |
| 2012/0049044 A1 | * | 3/2012 | Kuboi | ................. H01L 27/1464 250/208.1 |
| 2012/0143544 A1 | * | 6/2012 | Murata | ............. H01L 27/14665 702/64 |
| 2015/0090317 A1 | * | 4/2015 | Tokuoka | ............. H01L 31/0465 136/249 |
| 2015/0214391 A1 | * | 7/2015 | Hattori | ............... H01L 31/1804 136/256 |

FOREIGN PATENT DOCUMENTS

| | | |
|---|---|---|
| JP | 58-003273 A | 1/1983 |
| JP | 61-193479 A | 8/1986 |
| JP | H06-283695 A | 10/1994 |
| JP | 2011-228733 A | 11/2011 |
| JP | 2011-249677 A | 12/2011 |
| JP | 2012-114197 A | 6/2012 |
| JP | 2014-103133 A | 6/2014 |

* cited by examiner

*Primary Examiner* — Khaja Ahmad
(74) *Attorney, Agent, or Firm* — Canon U.S.A. Inc., IP Division

(57) ABSTRACT

A photoelectric conversion device includes a photoelectric conversion unit disposed above a substrate and a reading circuit. The photoelectric conversion unit includes a first electrode disposed above the substrate, a second electrode disposed above the first electrode, and a photoelectric conversion film disposed between the first electrode and the second electrode. The second electrode includes an opening, and is disposed in contact with the photoelectric conversion film at a boundary between adjacent photoelectric conversion units. An insulating film is disposed in contact with the second electrode.

20 Claims, 8 Drawing Sheets

PHOTOELECTRIC CONVERSION DEVICE AND IMAGING SYSTEM

BACKGROUND OF THE INVENTION

Field of the Invention

The present technique relates to a photoelectric conversion device and an imaging system.

Description of the Related Art

A photoelectric conversion device including a lower electrode disposed on a semiconductor substrate, a photoelectric conversion film disposed on the lower electrode, and a transparent upper electrode (transparent electrode) disposed on the photoelectric conversion film, has been known. Japanese Patent Application Laid-Open No. 2011-249677 discloses that wiring is arranged on a transparent electrode as a unit that inhibits shading caused by the high resistance of the transparent electrode and color mixture between pixels. The wiring has lower resistance than that of the transparent electrode, and a light blocking effect.

In the transparent electrode according to Japanese Patent Application Laid-Open No. 2011-249677, since attenuation of incident light also occurs, sensitivity may be degraded. The transparent electrode can be thinned so that the attenuation of incident light may be reduced. However, variation of a film thickness due to the reduction in thickness and variation of resistance may be a problem. In addition, when a light blocking wiring is disposed on the transparent electrode, optical color mixture occurs due to a large distance between the photoelectric conversion film and the wiring.

SUMMARY OF THE INVENTION

A photoelectric conversion device according to the present technique includes a photoelectric conversion unit disposed above a substrate and a reading circuit for reading a signal from the photoelectric conversion unit. The photoelectric conversion unit includes a first electrode disposed above the substrate, a second electrode disposed above the first electrode, and a photoelectric conversion film disposed between the first electrode and the second electrode. The second electrode is disposed in contact with the photoelectric conversion film and includes an opening. The second electrode is arranged on a boundary between adjacent photoelectric conversion units. An insulating film is disposed in contact with the second electrode.

Further features of the present invention will become apparent from the following description of exemplary embodiments (with reference to the attached drawings).

DESCRIPTION OF THE EMBODIMENTS

First Embodiment

Figure 1:
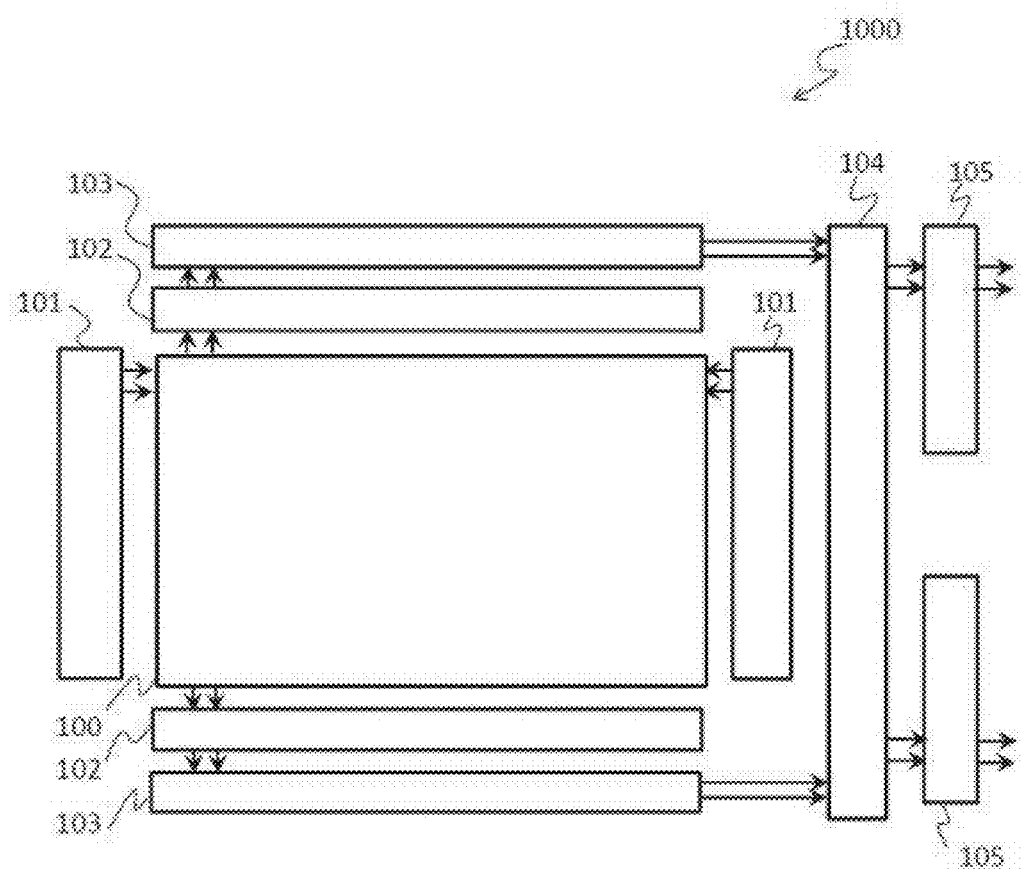
FIG. 1 is a schematic view of a photoelectric conversion device.

The present embodiment will be described with reference to FIGS. 1 to 6. FIG. 1 is a schematic view of a photoelectric conversion device 1000. The photoelectric conversion device 1000 includes a pixel unit 100, a vertical scanning unit 101, a reading signal processing unit 102, an AD conversion unit 103, a digital signal processing unit (digital front end, DFE) 104, and a signal output unit 105. The pixel unit 100 includes pixels arranged in a matrix therein. The vertical scanning unit 101 includes, for example, a shift register and a decoder, and supplies a control signal to each of the pixels in the pixel unit 100. The reading signal processing unit 102 includes, for example, an amplifier circuit and a correlated double sampling (CDS) circuit so as to amplify a signal acquired from the pixel unit 100 and eliminate noise from the signal acquired from the pixel unit 100. The AD conversion unit 103 converts a signal from the reading signal processing unit 102 into a digital signal. The DFE unit 104 performs appropriate signal processing, such as amplification and noise removal, to the digital signal output from the AD conversion unit 103. The signal output unit 105 includes a circuit that outputs a signal from the DFE unit 104. In the present embodiment, the reading signal processing unit 102 and the AD conversion unit 103 are disposed corresponding to a row of the pixel unit 100. The reading signal processing unit 102 and the AD conversion unit 103 may be also called a row reading signal processing unit and a row AD conversion unit, respectively. In the present embodiment, a pair of the reading signal processing units 102, as well as a pair of the AD conversion unit 103, is arranged while interposing the pixel unit 100 therebetween, and two signal output units 105 are provided so as to improve a reading speed. Note that although the pixel unit 100, the vertical scanning unit 101, the reading signal processing unit 102, the AD conversion unit 103, the DFE unit 104, and the signal output unit 105 are disposed on one chip in the present embodiment, any of the units may be disposed on another chip.

Figure 2A:
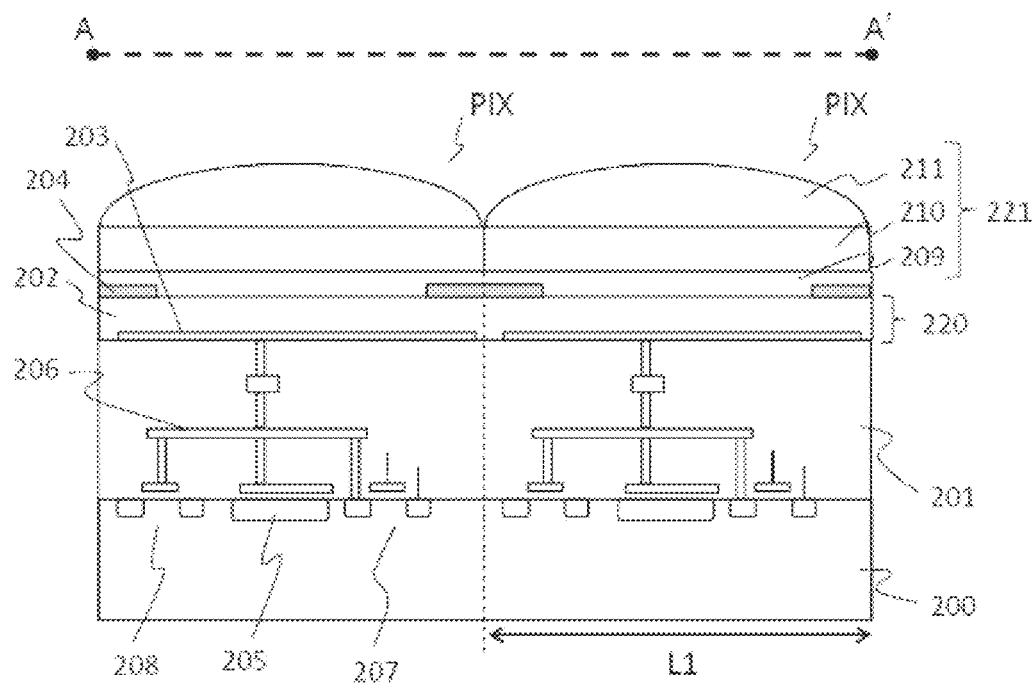
FIGS. 2A and 2B are a schematic cross-sectional view and a schematic plan view, respectively, of the photoelectric conversion device according to a first embodiment.

Next, the pixel of the photoelectric conversion device according to the present embodiment will be described with reference to FIG. 2A. FIG. 2A is a schematic cross-sectional view of two adjacent pixels PIX among the pixels PIX arranged in the pixel unit 100 illustrated in FIG. 1. The two pixels PIX have substantially the same configuration. The pixel PIX includes a substrate 200, a wiring structure unit 201 disposed on the substrate 200, a photoelectric conversion unit 220 disposed on the wiring structure unit 201, and an optical unit 221 disposed on the photoelectric conversion unit 220. The substrate 200 includes, for example, a silicon substrate, and includes an element such as a transistor formed thereon. In the present embodiment, the elements include a storage capacitor 205, an amplification transistor 208, and a reset transistor 207. These elements constitute the reading circuit of the pixel PIX. The wiring structure unit 201 includes a gate electrode of the transistor, a contact plug, a via plug, and wiring for acquiring an electrical connection of the transistor, and an interlayer insulating film for mutual insulation thereof. A conductor such as aluminum, copper, and tungsten used for a general semiconductor device can be used for the contact plug, the via plug, and the wiring. An insulating film including, for example, silicon oxide or silicon nitride can be used for the interlayer insulating film. The optical unit 221 includes a planarization layer 209, a color filter layer 210, and a microlens layer 211. An inorganic insulating film such as silicon oxide, silicon oxynitride, and silicon nitride, or an organic insulating film such as resin can be used for the planarization layer 209.

The photoelectric conversion unit 220 includes a first electrode 203, a photoelectric conversion film 202 disposed on the first electrode 203, and a second electrode 204 disposed on the photoelectric conversion film 202. The first electrode 203 and the second electrode 204 include, for example, aluminum. In particular, the second electrode 204 may be formed of an opaque material and preferably has light blocking function against incident light. The second electrode 204 is positioned on a boundary between the pixels PIX, and includes an opening corresponding to the center portion of the pixel PIX. In a plan view, the photoelectric conversion film 202 is partially exposed due to the opening, and is in contact with an insulating film such as the planarization layer 209. The boundary of the pixel PIX is, for example, a boundary between adjacent different color filter layers 210.

The photoelectric conversion film 202 includes a material capable of photoelectric conversion, such as an inorganic material or an organic material. In case of an inorganic material, for example, an amorphous silicon layer, an amorphous selenium layer, a quantum dot layer, a compound semiconductor layer can be appropriately selected for the photoelectric conversion film 202. In case of an organic material, a dye, such as a metal complex dye or a cyanine dye can be appropriately selected for the photoelectric conversion film 202. As another exemplary material, a derivative, such as acridine, coumarin, tryphenylmethane, fullerene, aluminum quinoline, polyparaphenylene vinylene, polyfluorene, polyvinyl carbazole, polythiol, polypyrrole, or polythiophene can be used for the photoelectric conversion film 202. As still another exemplary material for the photoelectric conversion film 202, the quantum dot layer can be used. The quantum dot layer includes, for example, a buffer material such as ALGAAS or GAAS, and quantum dots such as INAS or INGAAS. The quantum dot layer may be a layer in which a photoelectric conversion material is dispersed in a buffer material including an organic material.

Figure 2B:
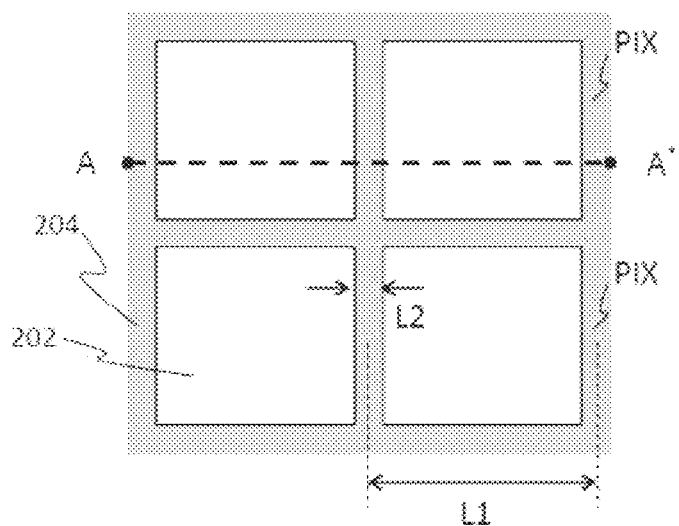

FIG. 2B is a schematic plan view of the photoelectric conversion device according to the present embodiment. The photoelectric conversion unit 220 including four pixels PIX is in a plan view. FIG. 2A is a schematic cross-sectional view taken along line A-A' of FIG. 2B. One pixel PIX has a width L1. It can be said that the pixels are arranged at a pitch of the width L1 in the pixel unit 100 in FIG. 1. The second electrode 204 has a width L2, and has a latticed plane shape. The lattice portion is disposed on a boundary of the color filter layer 210, namely, a boundary portion of the pixel PIX, in order to reduce optical color mixture between adjacent pixels PIX. The opening of the second electrode 204 exposes the photoelectric conversion film 202. The planarization layer 209 is disposed in contact with the exposed portion of the photoelectric conversion film 202. With this configuration, sensitivity of the photoelectric conversion film 202 is improved because no transparent electrode is disposed in an optical path to the photoelectric conversion film 202. Since the second electrode 204 is disposed in contact with the photoelectric conversion film 202, a distance between the second electrode 204 and the photoelectric conversion film 202 becomes shorter than that in a case where the transparent electrode exists. As a result, the optical color mixture can be further reduced.

Figure 3A:
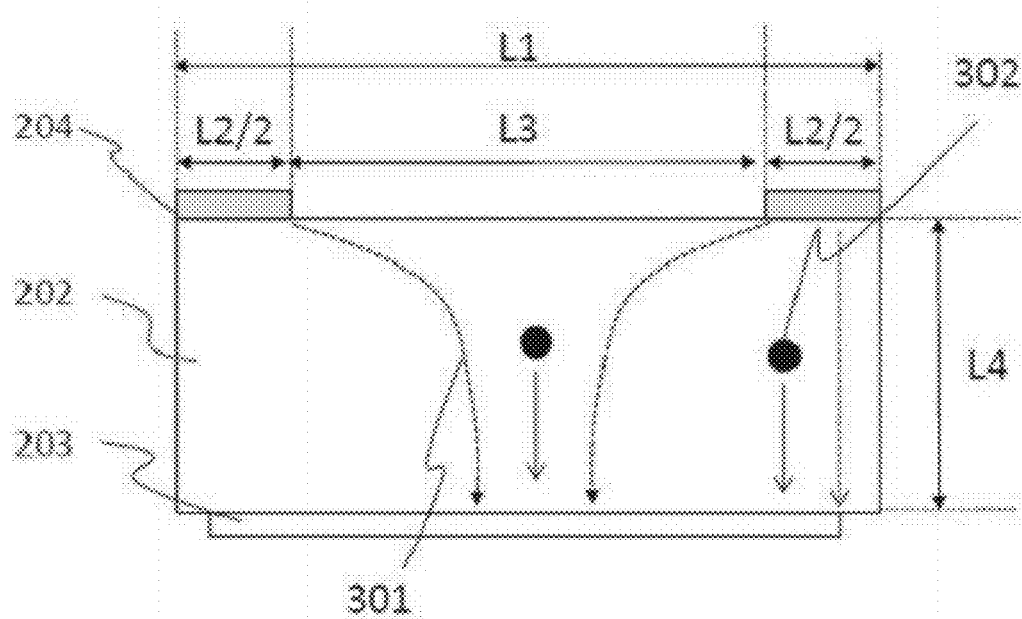
FIGS. 3A and 3B are schematic cross-sectional views of the photoelectric conversion device according to the first embodiment.
Figure 3B:
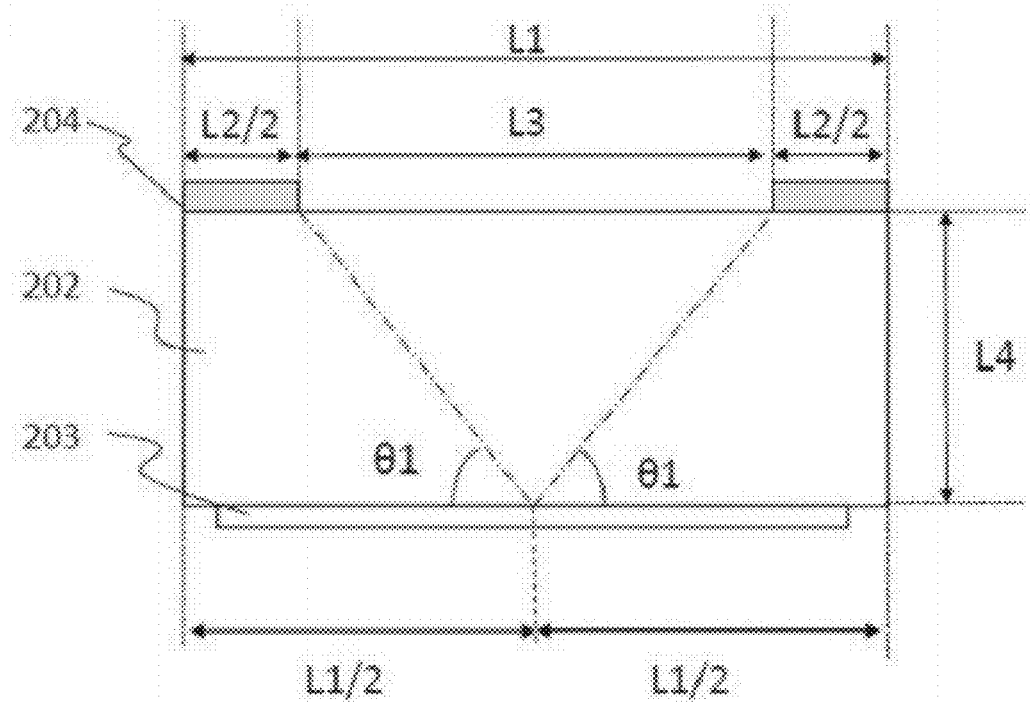

Here, a relationship among the photoelectric conversion film 202, the width L1 of the pixel PIX that is also a pixel pitch, and the width L2 of the second electrode 204 will be described with reference to FIGS. 3A and 3B. FIGS. 3A and 3B are schematic views of the photoelectric conversion unit 220. In FIGS. 3A and 3B, the second electrode 204 is disposed with a width of L2/2 at each end of the pixel PIX within the width L1 of the pixel PIX. It can be also said that the opening L3 of the second electrode 204 is equivalent to L1-L2. Here, a thickness of the photoelectric conversion film 202 is defined as L4. In the present embodiment, a unit of L1, L2, L3, and L4 is μm. In the present embodiment, for example, the width L1 of the pixel PIX satisfies 1.5 μm $\leq L1 \leq 3.0$ μm.

A dotted line in FIG. 3A represents an electric field 301 from the second electrode 204 to the first electrode 203. Signal charges (here, holes) 302 caused by photoelectric conversion are collected to the first electrode 203 by the electric field 301. In this case, when $L3<4\times(L4)$ is satisfied, the signal charges 302 generated in the center portion of the photoelectric conversion film 202 can be collected to the first electrode 203. With the condition, the signal charges 302 can be collected without disposition of the transparent electrode. Furthermore, as illustrated in FIG. 3B, the width L3 of the opening is denoted by $L3=L4\times\tan(\theta 1)\times 2$. Considering that the electric field 301 is applied to the center of the opening, $\theta 1=45°$ is preferred. Thus, $L3=L4\times 2$ is preferred. With the condition, collecting efficiency of the signal charges can be improved.

Figure 4:
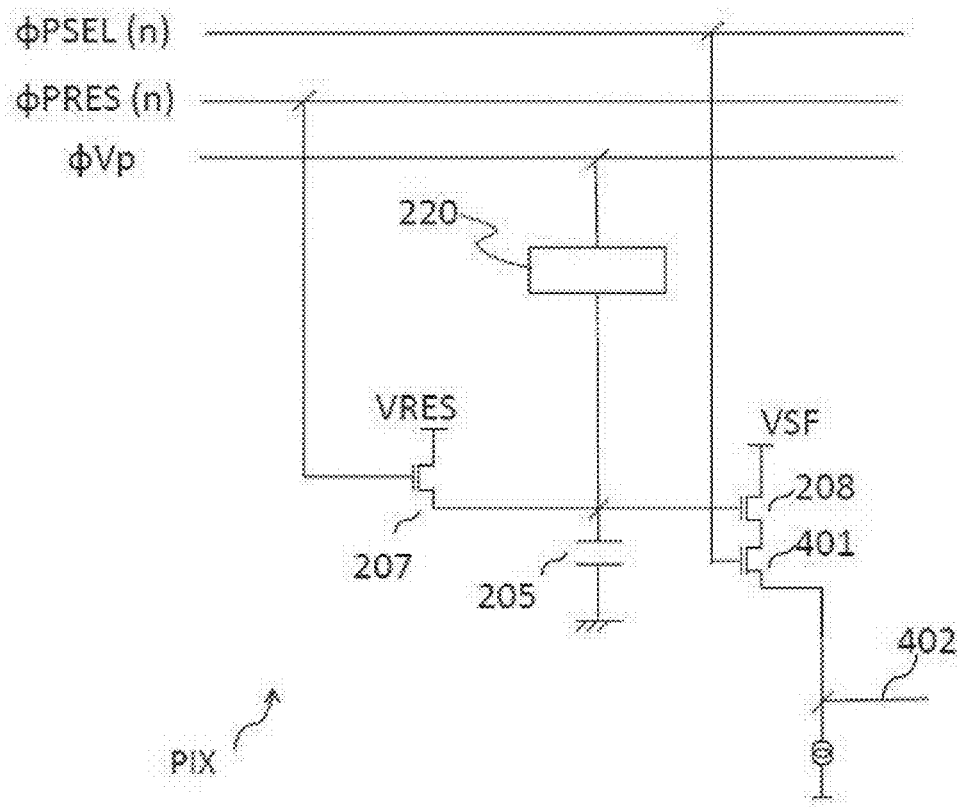
FIG. 4 is an equivalent circuit diagram of a pixel of the photoelectric conversion device according to the first embodiment.

Next, an equivalent circuit of one pixel PIX in the photoelectric conversion device according to the present embodiment will be described with reference to FIG. 4. The pixel PIX includes the photoelectric conversion unit 220, the reset transistor 207, the amplification transistor 208, a row selecting transistor 401, and the storage capacitor 205. The row selecting transistor 401 and the storage capacitor 205 may be omitted. An appropriate configuration can be added, such as disposing a transfer transistor between the photoelectric conversion unit 220 and the amplification transistor 208. The row selecting transistor 401 is coupled to a signal wire 402, and the signal wire 402 is coupled to the reading signal processing unit 102 illustrated in FIG. 1. The amplification transistor 208 constitutes a source follower circuit together with a current source (constant current source in the present embodiment) disposed in the signal wire 402. Here, reference symbol ΦPSEL(n) denotes a control signal supplied to a gate electrode of the row selecting transistor 401. Reference symbol ΦPRES(n) denotes a control signal supplied to a gate electrode of the reset transistor 207. Reference symbol ΦVp denotes a control signal supplied to the second electrode 204 of the photoelectric conversion unit 220.

Figure 5:
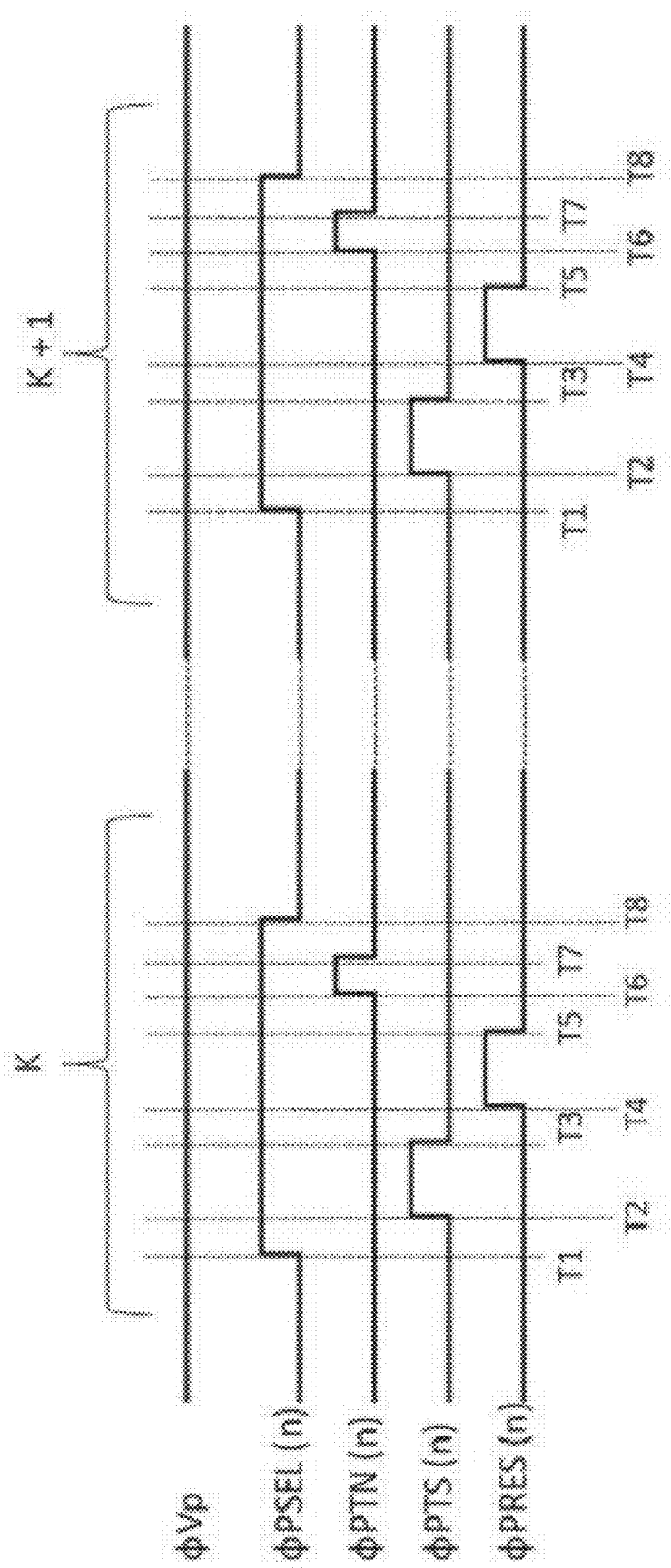
FIG. 5 is a diagram of operation of the pixel of the photoelectric conversion device according to the first embodiment.

Drive timing of the pixel PIX will be described with reference to FIG. 5. FIG. 5 illustrates operation of a pixel in the Nth row among pixels arranged in a matrix in terms of a Kth frame and a (K+1)th frame (N and K are natural numbers). When ΦPSEL(n) is at a high level, the row selecting transistor 401 is turned on. When ΦPSEL(n) is at a low level, the row selecting transistor 401 is turned off. When ΦPRES(n) is at a high level, the reset transistor 207 is turned on. When ΦPRES(n) is at a low level, the reset transistor 207 is turned off. In the present embodiment, ΦVp is constantly at a high level. Reference symbols ΦPTN(n) and ΦPTS(n) are signal holding circuits not shown in FIG. 4. For example, the signal holding circuits are disposed in the reading signal processing unit 102 in FIG. 1. When ΦPTN(n) is switched from a high level to a low level, one signal is held. When ΦPTS(n) is switched from a high level to a low level, another signal is held.

From time T1 to time T8 in FIG. 5, when ΦPSEL(n) turns to the high level, the row selecting transistor 401 is turned on. Therefore, a signal corresponding to electric potential of a node coupled to the storage capacitor 205 is output to the signal wire 402 in FIG. 4. From time T2 to time T3, when ΦPTS(n) turns to the high level, a first signal based on the signal charges having been stored is held in the signal holding circuit. From time T4 to time T5, when ΦPRES(n) turns to the high level, the reset transistor 207 is turned on. As a result, a node coupled to the first electrode 203 of the photoelectric conversion film 202, the storage capacitor 205, and a gate electrode of the amplification transistor 208, is reset. From time T6 to time T7, when ΦPTN(n) turns to the high level, a second signal based on the electric potential of the reset node is held in the signal holding circuit. Through reading of another row and the like, reading of the (K+1)th frame begins. In the (K+1)th frame, from time T1 to time T8, the same operation as that in the Kth frame from time T1 to time T8 is performed. A storing period in the photoelectric conversion unit 220 is a period from time T5 of the Kth frame to time T2 of the (K+1)th frame. A signal having been stored during the storing period is held in the signal holding circuit from time T2 to time T3 as a first signal of the (K+1)th frame. The photoelectric conversion device according to the present embodiment can be operated in this manner.

In the present embodiment, the opening of the second electrode 204 includes a square in a plan view. However, the opening may have any shape, such as a precise circle, an ellipse, or a rectangle.

Second Embodiment

A photoelectric conversion device according to the present embodiment will be described with reference to FIGS. 6 and 7. The photoelectric conversion device according to the present embodiment includes a photoelectric conversion unit 220', which has a different configuration from that of the photoelectric conversion device according to the first embodiment. In the following descriptions, similar constituent elements to those of the photoelectric conversion device in the first embodiment are denoted with the same reference signs, and duplicate descriptions thereof are omitted.

Figure 6:
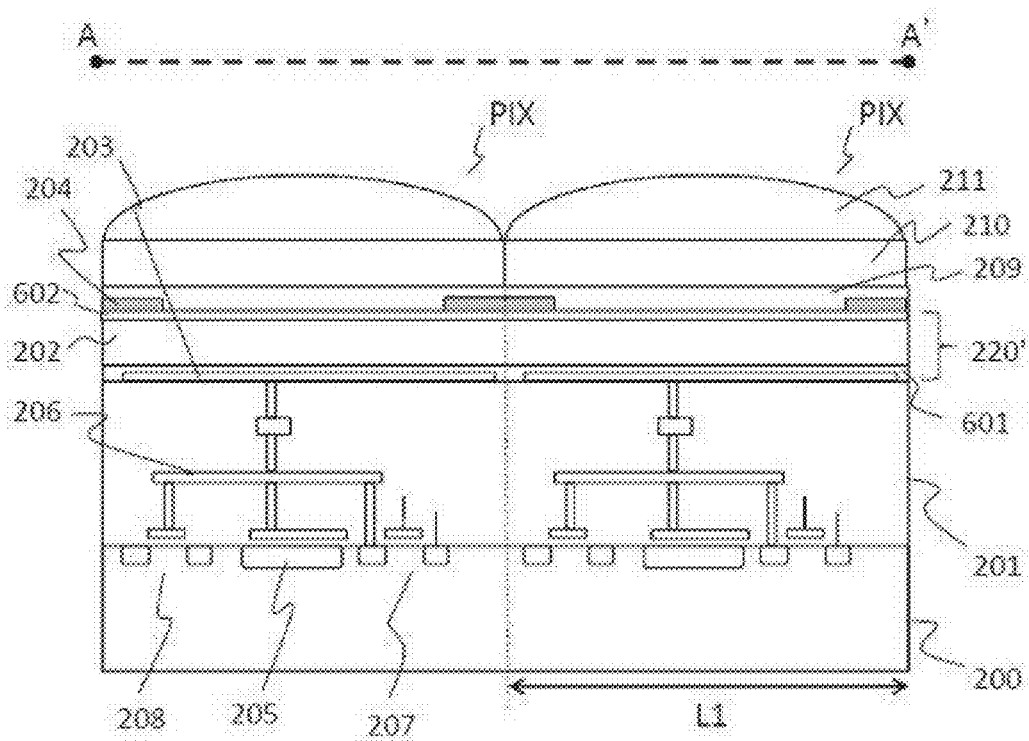
FIG. 6 is a schematic cross-sectional view of a photoelectric conversion device according to a second embodiment.
Figure 7:
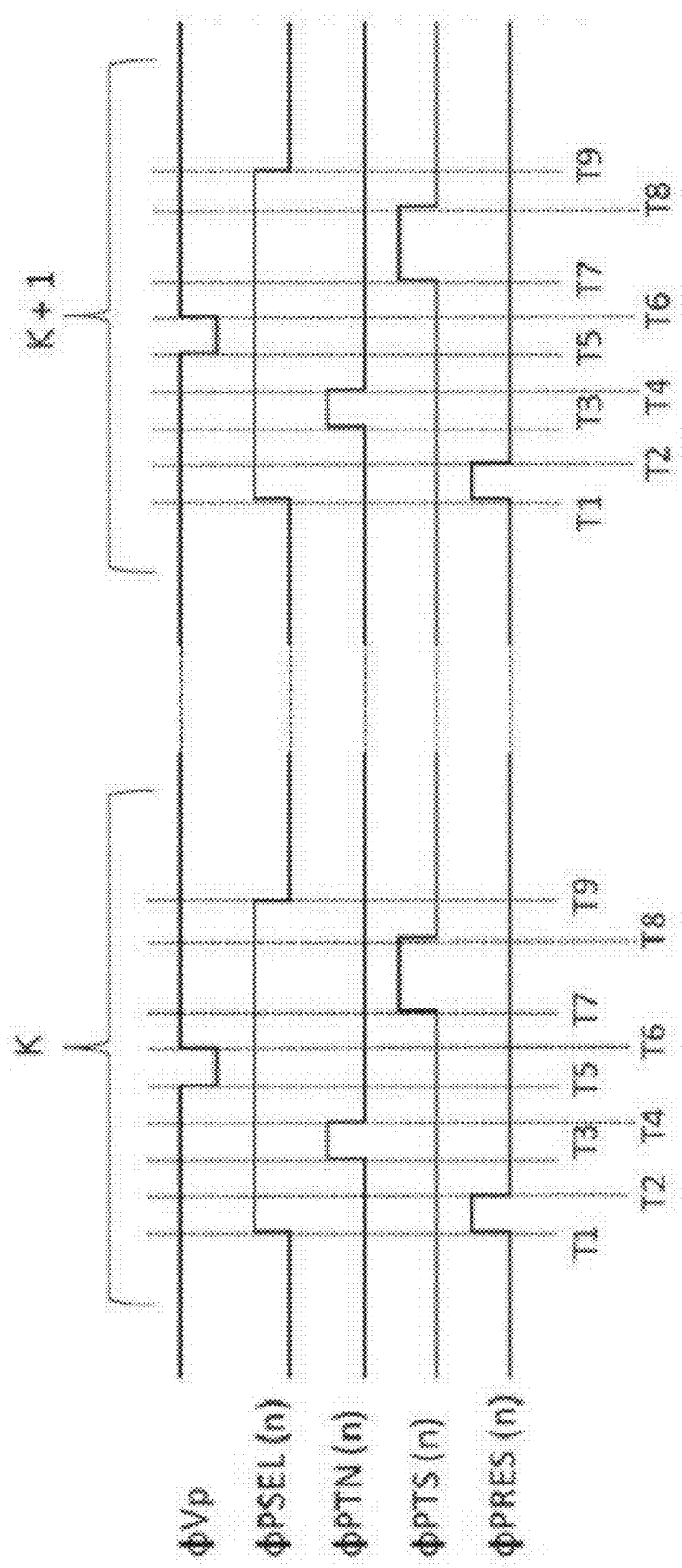
FIG. 7 is a diagram of operation of a pixel of the photoelectric conversion device according to the second embodiment.

FIG. 6 is a schematic cross-sectional view of two pixels PIX of the photoelectric conversion device, corresponding to FIG. 2A in the first embodiment. In FIG. 6, the photoelectric conversion unit 220' includes an insulating film 601 disposed between a first electrode 203 and a photoelectric conversion film 202, and a blocking layer 602 disposed between the photoelectric conversion film 202 and a second electrode 204. The insulating film 601 inhibits electric charges, such as electrons and holes, from being injected into the first electrode 203. The insulating film 601 includes at least one layer, for example, a silicon oxide film, a silicon oxynitride film, or a silicon nitride film, and may include a layered film thereof. The blocking layer 602 prevents the holes from being injected from the second electrode 204 to the photoelectric conversion film 202. In a case where the electric charges stored in the photoelectric conversion film 202 are holes, for example, a high concentration N-type semiconductor layer can be used for the blocking layer 602. Meanwhile, in a case where the electric charges stored in the photoelectric conversion film 202 are electrons, for example, a high concentration P-type semiconductor layer can be used for the blocking layer 602. When a semiconductor layer is used, the semiconductor layer also serves as an auxiliary electrode for the second electrode 204. Therefore, collecting efficiency of signal charges is improved as compared with that in the first embodiment. In the present embodiment, the electric charges stored in the photoelectric conversion film 202 are holes.

Next, drive timing of a pixel PIX of the photoelectric conversion device according to the present embodiment will be described with reference to FIG. 7. First, an equivalent circuit of the pixel PIX is similar to that in the first embodiment, as illustrated in FIG. 4. FIG. 7 is a diagram of the drive timing corresponding to that in FIG. 5. As in FIG. 5, FIG. 7 illustrates operation of a pixel in the Nth row among pixels arranged in a matrix in terms of a Kth frame and a (K+1)th frame (N and K are natural numbers). The duplicate descriptions of similar constituent elements to those in FIG. 5 are omitted. The operation according to the present embodiment is different from that in the first embodiment in that a level of ΦVp varies. The detailed description will be given below.

From time T1 to time T9, when ΦPSEL(n) turns to a high level, a row selecting transistor 401 is turned on. As a result, a signal corresponding to electric potential of a node coupled to a storage capacitor 205 is output to a signal wire 402 in FIG. 4. From time T1 to time T2, when ΦPRES(n) turns to a high level, a reset transistor 207 is turned on. Therefore, a node coupled to the first electrode 203 of the photoelectric conversion film 202, the storage capacitor 205, and a gate electrode of an amplification transistor 208, is reset. Here, since an insulating film 601 is disposed between the photoelectric conversion film 202 and the first electrode 203, the photoelectric conversion film 202 has held signal charges. Here, from time T1, ΦVp remains at a high level. From time T3 to time T4, when ΦPTN(n) turns to a high level, a signal holding circuit holds a second signal based on the electric potential of the reset node. From time T5 to time T6, when ΦVp turns to a low level, the electric charges in the photoelectric conversion film 202 are discharged from the second electrode 204. After that, the photoelectric conversion film 202 is reset. Here, the first electrode 203 faces the photoelectric conversion film 202 with the insulating film 601 interposed therebetween. In accordance with a quantity Q1 of the signal charges discharged from the photoelectric conversion film 202, a change in the electric charges, which is equivalent to the quality Q1, occurs on the first electrode 203. From time T7 to time T8, when ΦPTS(n) turns to a high level, a signal corresponding to electric potential of the storage capacitor 205, in which the electric charges are changed by the signal charge quantity Q1 from the reset state, is held in the signal holding circuit. The signal in accordance with the electric potential of the storage capacitor 205 is a first signal. As described above, the second signal and the first signal of the Kth frame can be read. Through reading of another row and the like, reading of a (K+1)th frame begins. In the (K+1)th frame from time T1 to time T9, the same operation as that in the Kth frame from time T1 to time T9 is performed. A storing period in the photoelectric conversion unit 220 is a period from time T6 of the Kth frame to time T5 of the (K+1)th frame. A signal having been stored during the storing period is held in the signal holding circuit from time T7 to time T8 as a first signal of the (K+1)th frame. The photoelectric conversion device according to the present embodiment can be operated in this manner.

In the present embodiment, a kTC noise that may be generated when the node coupled to the gate electrode of an amplification transistor 208 is reset, can be reduced. In the present embodiment, the insulating film 601 is disposed between the first electrode 203 and the photoelectric conversion film 202. With this configuration, the operation illustrated in FIG. 7 can be performed. Therefore, the storing period of the photoelectric conversion unit 220' can be easily determined as compared with the first embodiment. In addition, the blocking layer 602 is disposed between the photoelectric conversion film 202 and the second electrode 204 so that leakage of the signal charges can be reduced and a signal having less noise can be obtained. In the present embodiment, the blocking layer 602 may be omitted. The blocking layer 602 may be provided in the configuration of the first embodiment.

Third Embodiment

A photoelectric conversion device according to the present embodiment will be described with reference to FIG. 8. The photoelectric conversion device according to the present embodiment includes a second electrode 204', which has a different configuration from that of the photoelectric conversion device according to the first embodiment. In the following descriptions, similar constituent elements to those of the photoelectric conversion device in the first embodiment are denoted with the same reference signs, and duplicate descriptions thereof are omitted.

Figure 8:
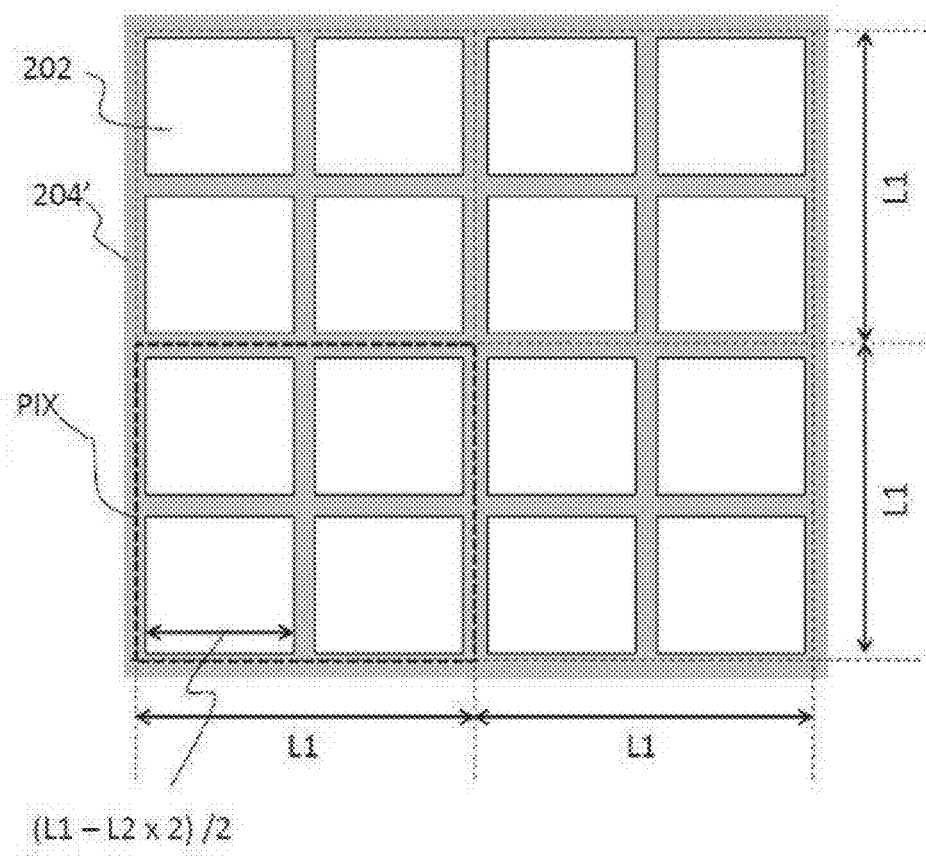
FIG. 8 is a schematic plan view of a photoelectric conversion device according to a third embodiment.

FIG. 8 is a schematic plan view of a photoelectric conversion unit 220 including four pixels PIX, corresponding to FIG. 2B in the first embodiment. A second electrode 204' has four openings for one pixel PIX, and includes a cross-shaped portion at the center of the pixel PIX. Each of the four openings has a width (L1−2×L2)/2. As described above, the cross-shaped portion is provided at the center of the opening in the first embodiment so that an electric field can be easily generated to the photoelectric conversion film 202 and collecting efficiency of signal charges can be improved.

In the present embodiment, the opening of the second electrode 204' includes a square in a plan view. However, the opening may have any shape, such as a precise circle, an ellipse, or a rectangle. In addition, the number of openings per pixel PIX is not limited to four.

As an exemplary application of the photoelectric conversion devices according to the respective embodiments, an imaging system including the photoelectric conversion device embedded therein will be described below using a camera. A concept of the camera includes not only a device for photographing as a main purpose but also a device supplementarily including a photographing function (for example, personal computer or portable terminal). The camera includes the photoelectric conversion device according to the present technique disclosed as the above embodiment, and a processing unit that processes a signal output from the photoelectric conversion device. The processing unit may have a function of detecting a phase difference between light beams mutually travelling through different regions in a pupil of a photographing lens, based on a signal read from a pixel. The processing unit may have a function of controlling, based on the phase difference, a driving unit of an imaging lens (typically, a focusing lens in the imaging lens) and performing auto-focus.

The above respective embodiments are exemplary for performing the present technique. Alterations may be made without departing from the technical idea of the present technique. In addition, elements of the embodiments can be combined.

According to the present technique, in a photoelectric conversion device in which a photoelectric conversion film is layered, degradation in sensitivity and optical color mixture can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-199154, filed Sep. 29, 2014, which is hereby incorporated by reference herein in its entirety.

What is claimed is:

1. A photoelectric conversion device comprising:
a substrate having a circuit;
an insulating film disposed above the substrate;
a photoelectric conversion film disposed between the substrate and the insulating film;
a plurality of first electrodes disposed between the photoelectric conversion film and the substrate, and connected to the circuit, the plurality of first electrodes include one electrode and another electrode separated from the one electrode; and
a second electrode disposed between the insulating film and the photoelectric conversion film,
wherein the second electrode has a first opening above the one electrode and a second opening above the another electrode, and
the insulating film continuously covers the first opening and the second opening in contact with the photoelectric conversion film through the first opening and the second opening.

2. The photoelectric conversion device according to claim 1, wherein the following expression is satisfied:

$$L3 < 4 \times (L4)$$

where L4 represents a thickness of the photoelectric conversion film, and L3 represents a diameter of the opening.

3. The photoelectric conversion device according to claim 1, wherein the second electrode is formed of an opaque material.

4. An imaging system comprising the photoelectric conversion device according to claim 1; and
a processing unit configured to process a signal from the photoelectric conversion device.

5. The photoelectric conversion device according to claim 1, wherein the insulating film is in contact with the second electrode.

6. The photoelectric conversion device according to claim 1, wherein the second electrode is in contact with the photoelectric conversion film.

7. The photoelectric conversion device according to claim 1, wherein the second electrode includes a first portion that overlaps the one electrode, and a second portion that does not overlap the one electrode and the another electrode.

8. The photoelectric conversion device according to claim 7, wherein the second electrode includes a third portion that overlaps the another electrode.

9. The photoelectric conversion device according to claim 1, wherein the second electrode is formed of aluminum.

10. A photoelectric conversion device comprising:
a substrate having a circuit;
an insulating film disposed above the substrate;
a photoelectric conversion film disposed between the substrate and the insulating film;
a plurality of first electrodes disposed between the photoelectric conversion film and the substrate, and connected to the circuit, the plurality of first electrodes include one electrode and another electrode separated from the one electrode;
a second electrode disposed between the insulating film and the photoelectric conversion film; and
a semiconductor layer disposed between the second electrode and the photoelectric conversion film,
wherein the second electrode has a first opening above the one electrode and a second opening above the another electrode, and the insulating film continuously covers the first opening and the second opening in contact with the semiconductor layer through the first opening and the second opening.

11. The photoelectric conversion device according to claim 10, wherein the second electrode is formed of an opaque material.

12. The photoelectric conversion device according to claim 10, wherein the second electrode is in contact with the semiconductor layer.

13. The photoelectric conversion device according to claim 10, wherein the second electrode includes a first portion that overlaps the one electrode, a second portion that does not overlap the one electrode and the another electrode, and a third portion that overlaps the another electrode.

14. An imaging system comprising:
the photoelectric conversion device according to claim 10; and
a processing unit configured to process a signal from the photoelectric conversion device.

15. A photoelectric conversion device comprising:
a substrate having a circuit;
a first insulating film disposed above the substrate;
a photoelectric conversion film disposed between the substrate and the first insulating film;
a plurality of first electrodes disposed between the photoelectric conversion film and the substrate, and connected to the circuit, the plurality of first electrodes include one electrode and another electrode separated from one electrode;
a second electrode disposed between the first insulating film and the photoelectric conversion film; and
a second insulating film disposed between the plurality of first electrodes and the photoelectric conversion film,
wherein the second electrode has a first opening above the one electrode and a second opening above the another electrode, and the second electrode includes a first portion that overlaps the one electrode, and a second portion that does not overlap the one electrode and the another electrode, and
wherein the first insulating film continuously covers the first opening and the second opening, and the second insulating film continuously covers the one electrode and the another electrode.

16. The photoelectric conversion device according to claim 15, wherein the second electrode is formed of an opaque material.

17. The photoelectric conversion device according to claim 15, wherein the first insulating film is in contact with at least one of the photoelectric conversion film and the second electrode.

18. The photoelectric conversion device according to claim 15, wherein the second electrode includes a third portion that overlaps the another electrode.

19. The photoelectric conversion device according to claim 15, further comprising a blocking layer disposed between the second electrode and the photoelectric conversion film.

20. An imaging system comprising:
the photoelectric conversion device according to claim 15; and
a processing unit configured to process a signal from the photoelectric conversion device.

* * * * *